(12) United States Patent
Ong et al.

(10) Patent No.: US 7,945,824 B2
(45) Date of Patent: *May 17, 2011

(54) PROCESSOR-MEMORY UNIT FOR USE IN SYSTEM-IN-PACKAGE AND SYSTEM-IN-MODULE DEVICES

(75) Inventors: Adrian E. Ong, Pleasanton, CA (US); Naresh Baliga, El Dorado Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/646,540

(22) Filed: Dec. 23, 2009

(65) Prior Publication Data

US 2010/0100661 A1  Apr. 22, 2010

Related U.S. Application Data

(63) Continuation of application No. 11/208,099, filed on Aug. 18, 2005, now Pat. No. 7,673,193.

(51) Int. Cl.
*G11C 29/00* (2006.01)

(52) U.S. Cl. .............. 714/718; 714/25; 714/30; 714/42; 714/54; 714/710; 714/711; 714/719; 714/725; 714/742; 714/733; 714/734; 324/765; 365/201

(58) Field of Classification Search .................. None
See application file for complete search history.

(56) References Cited

U.S. PATENT DOCUMENTS

| | | |
|---|---|---|
| 5,594,694 A | 1/1997 | Roohparvar |
| 5,825,697 A | 10/1998 | Gilliam |
| 6,191,603 B1 | 2/2001 | Muradali |
| 6,365,421 B2 | 4/2002 | Debenham |
| 6,457,141 B1 | 9/2002 | Kim |
| 6,492,727 B2 | 12/2002 | Nishizawa |
| 6,519,171 B2 | 2/2003 | Matsuzaki |
| 6,531,339 B2 | 3/2003 | King |
| 6,711,042 B2 * | 3/2004 | Ishikawa ................. 365/51 |
| 6,732,304 B1 * | 5/2004 | Ong ........................ 714/718 |
| 6,812,726 B1 | 11/2004 | Ong |
| 6,816,983 B2 * | 11/2004 | Kurafuji ................... 714/30 |
| 6,825,683 B1 | 11/2004 | Berndt |
| 6,882,171 B2 | 4/2005 | Ong |
| 6,967,397 B2 | 11/2005 | Inoue |
| 6,973,405 B1 * | 12/2005 | Ansari ..................... 702/117 |
| 6,996,745 B1 | 2/2006 | Shaylor |
| 7,006,940 B1 | 2/2006 | Ong |
| 7,053,470 B1 | 5/2006 | Sellers |
| 7,061,263 B1 | 6/2006 | Ong |
| 7,075,175 B2 | 7/2006 | Kazi |
| 7,133,798 B1 | 11/2006 | Ong |
| 7,139,945 B2 | 11/2006 | Ong |
| 7,149,135 B2 | 12/2006 | Okuno |
| 7,249,301 B2 * | 7/2007 | Perner ..................... 714/733 |
| 7,269,765 B1 | 9/2007 | Charlton |
| 7,305,595 B2 | 12/2007 | Goodwin |

(Continued)

*Primary Examiner* — John P Trimmings
(74) *Attorney, Agent, or Firm* — Park, Vaughan, Fleming & Dowler LLP

(57) ABSTRACT

An apparatus and method for a processor-memory unit for use in system-in-package (SiP) and system-in-package (SiP) integrated circuit devices. The apparatus includes a processing module, a memory module and a programmable system module. The programmable system module is configured to function as an interface between the memory module and the processing module, or as an interface between the memory module and a testing device. The invention facilitates integration and testing of processor-memory units including functional components having different communication protocols.

33 Claims, 3 Drawing Sheets

U.S. PATENT DOCUMENTS

| | | | |
|---|---|---|---|
| 7,325,178 B2 * | 1/2008 | Damodaran et al. | 714/718 |
| 7,353,442 B2 * | 4/2008 | Bahl et al. | 714/733 |
| 7,360,130 B2 * | 4/2008 | Margolin | 714/718 |
| 7,484,188 B2 * | 1/2009 | Duan et al. | 716/4 |
| 2001/0032305 A1 * | 10/2001 | Barry | 712/34 |
| 2002/0178416 A1 * | 11/2002 | Chen et al. | 714/733 |
| 2003/0120985 A1 * | 6/2003 | Slobodnik et al. | 714/718 |
| 2004/0100296 A1 | 5/2004 | Ong | |
| 2004/0196709 A1 | 10/2004 | Ong | |
| 2005/0024977 A1 | 2/2005 | Ong | |
| 2005/0204223 A1 | 9/2005 | Ong | |
| 2005/0289428 A1 | 12/2005 | Ong | |
| 2006/0152241 A1 | 7/2006 | Ong | |
| 2008/0133206 A1 * | 6/2008 | Devins et al. | 703/15 |
| 2008/0313583 A1 * | 12/2008 | Brinson et al. | 716/4 |

* cited by examiner

PROCESSOR-MEMORY UNIT FOR USE IN SYSTEM-IN-PACKAGE AND SYSTEM-IN-MODULE DEVICES

RELATED APPLICATION

This application is a continuation of, and hereby claims priority under 35 U.S.C §120 to, U.S. patent application Ser. No. 11/208,099, entitled "PROCESSOR-MEMORY UNIT FOR USE IN SYSTEM-IN-PACKAGE AND SYSTEM-IN-MODULE DEVICES," by inventors Adrian E. Ong and Naresh Baliga, filed on 18 Aug. 2005, which is hereby incorporated by reference.

BACKGROUND OF THE INVENTION

1. Field of the Invention

The present invention generally relates to the field of integrated circuit devices and, in particular, system-in-package and system-in-module integrated circuit devices.

2. Description of the Related Art

Large integrated circuit (IC) devices may be fabricated as system-on-chip (SoC), system-in-package (SiP), and system-in-module (SiM) devices. In a SoC device, various functional components (e.g., processors, application-specific integrated circuits (ASICs), memory devices, and the like) are integrated onto a die. Accordingly, in a SiP device or a SiM device, different types and generations (e.g., versions) of SoC devices are combined in a single package (SiP device), assembly or module (SiM device), the package, assembly or module including several SoC and/or SiP devices.

SiP and SiM devices are not limited by constraints associated with the size of the die and use of a common fabricating process for individual functional components of a single-die IC device. As such, the SiP and SiM devices can be designed and manufactured for a different range of specific functions than SoC devices.

System integration within a SiP or SiM device, including different functional components each developed to a unique specification, may represent a problematic task. Conventionally, signal/protocol compatibility of various combinations of a processor (e.g., ASIC) and memory devices (such combinations are referred herein as "processor-memory units") is accomplished by using specialized circuits matching interfacing requirements of component devices of the processor-memory unit, as well as facilitating testability of the component devices. However, this approach requires development of a large number of narrowly specialized interfacing and testing circuits and, therefore, is inefficient Therefore, there is a need in the art for improved systems and methods for a processor-memory unit for use in SiP and SiM devices.

SUMMARY OF THE INVENTION

Various deficiencies of the prior art are addressed by the present invention of a processor-memory unit for use in SiP or SiM devices. Various embodiments of the processor-memory unit facilitate system integration and testing of component functional devices of the processor-memory unit. In various embodiments, such functional devices include various types of processors, ASICs, and/or memory devices.

In various embodiments of the invention, a processor-memory unit includes at least one processor and/or at least one ASIC, a memory module including at least one memory bank, and a programmable system module. A memory bank may include one or more memory storage devices (e.g., memory cells). The system module is programmable to provide signal/protocol compatibility for communications between a processing module (including the processor and/or ASIC) and the memory module, as well as in-situ testing of these modules. Each of the processing module and memory module may comprise devices having different component functionality (e.g., different processors and/or memory banks, communication protocols, etc.). The programmable features of the system module are used to provide compatibility between these various component functionalities, without the need to provide a different specialized circuit for each possible combination of components.

Various embodiments of the invention include methods of facilitating system-level compatibility and testability of the modules and component functional devices of the processor-memory unit.

Various embodiments of the invention include a processor-memory unit comprising a processing module including at least one processor or at least one logic application-specific circuit (ASIC), the processing module being included in a system-in-package (SiP) or system-in-module (SiM) device, a memory module including at least a first memory bank, and being including in the same in a system-in-package (SiP) or system-in-module (SiM) device as the processing module, and a programmable system module coupled to the processing module and the memory module, the programmable system module being programmable to provide signal/protocol compatibility between the processing module and the memory module.

Various embodiments of the invention include a method comprising (a) receiving a processing module including at least one processor and/or at least one logic application-specific circuit (ASIC), (b) receiving a memory module including at least one memory bank, (c) receiving a programmable system module coupled to the processing module and the memory module, the processing module, memory module and programmable system module being configured for inclusion in a system-in-package (SiP) or system-in-module (SiM) device, (d) programming the system module to provide signal/protocol compatibility between the processing module and the memory module, (e) facilitating data and command interfaces between the processing module and the system module, (f) facilitating data and command interfaces between the system module and the memory module, and (g) exchanging information between the processing module and the memory module using the system module.

BRIEF DESCRIPTION OF THE DRAWINGS

The teachings of the present invention will become apparent by considering the following detailed description in conjunction with the accompanying drawings, in which.

The appended drawings illustrate exemplary embodiments of the invention and, as such, should not be considered limiting the scope of the invention that may admit to other equally effective embodiments.

DETAILED DESCRIPTION OF THE INVENTION

Various embodiments of the invention generally relate to a processor-memory unit for inclusion in a SIP or SiM device. The processor-memory unit includes a system module configured to facilitate system integration and/or testing of different types of modules and component functional devices (e.g., different types of processors, ASICs, and/or memories) within the processor-memory unit.

Some embodiments of the invention may be advantageously utilized in consumer products, such as digital cameras, gaming devices, media players, and the like. It will be appreciated by those skilled in the art that the invention may also be equally efficiently utilized within the context of other computerized products and devices.

Figure 1:
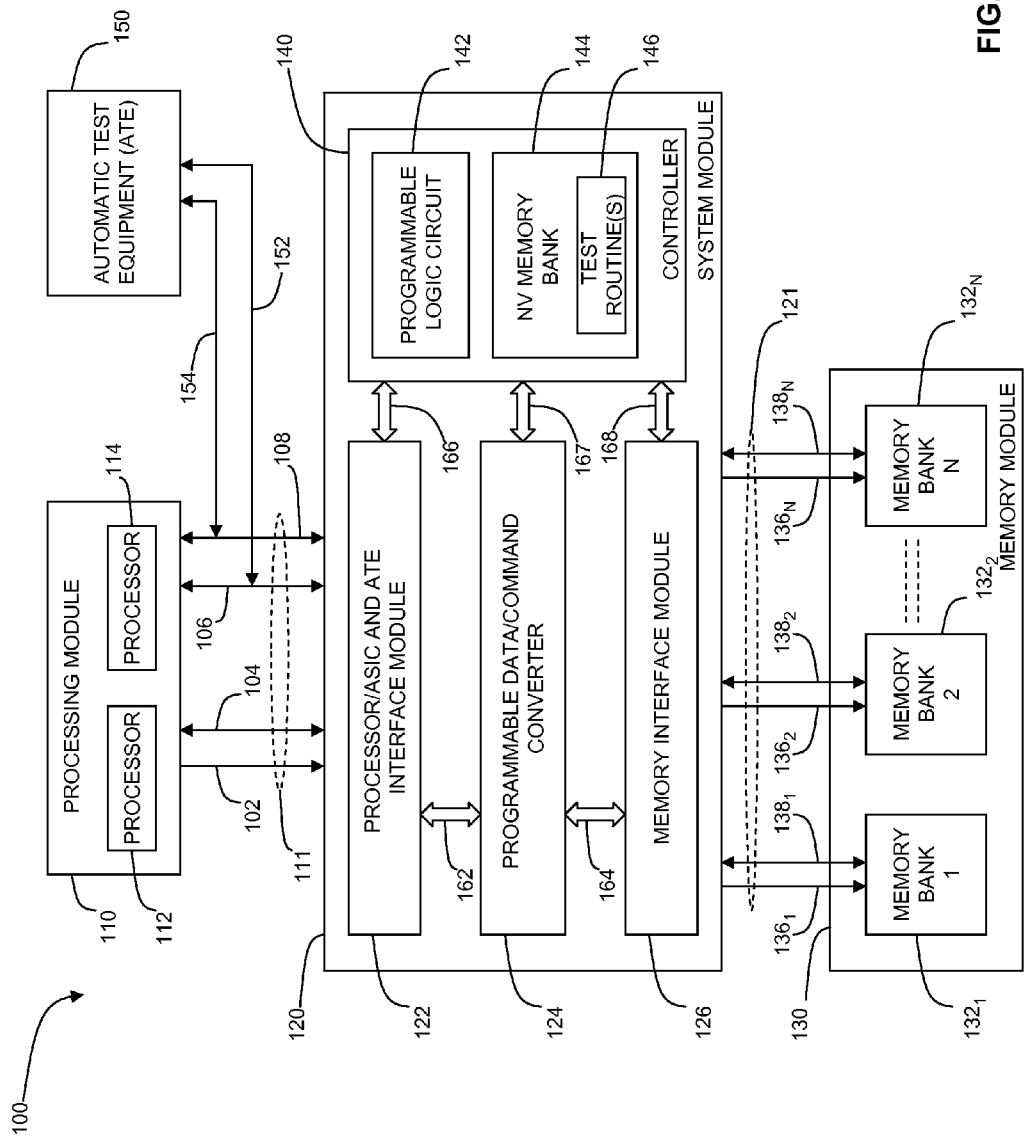
FIG. 1 depicts a block diagram of an exemplary processor-memory unit (PMU) for inclusion in a SiP or SiM device, in accordance with various embodiments of the present invention.

FIG. 1 depicts a block diagram of an exemplary processor-memory unit (PMU) 100 for inclusion in a SiP or SiM device in accordance with various embodiments of the present invention. Hereafter, similar apparatuses, devices and interfaces are identified using the same numeric references, except that suffixes may be added, when appropriate, to differentiate such apparatuses, devices, and interfaces. Additionally, for a purpose of brevity, the term "data" is used herein in reference to both data and address information, e.g., data interfaces encompass both data and address buses to/from the respective functional components of the PMU 100.

In the embodiments depicted by FIG. 1, the PMU 100 comprises a processing module 110, a system module 120 encompassing programmable processor/ASIC-memory interfacing capabilities, and a memory module 130. The processing module 110 is coupled to the system module 120, and the system module 120 is coupled to the memory module 130 using data/command buses 111 and 121, respectively. Typically, system module 120 acts as an interface between processing module 110 and memory module 130. The modules of the PMU 100, as well as their functional components, may be embodied in either separate dies within one or more IC (integrated circuit) packages or separately packaged IC devices.

In various embodiments, the processing module 110 includes at least one processor (processors 112 and 114 are illustratively shown) and/or at least one logic ASIC (not shown), which optionally use the same bus 111 and optionally have the same or similar interfacing requirements for communicating to memory devices. The memory module 130 may consist of at least one memory bank 132 (memory banks $132_1$-$132_N$ are shown, where N is an integer and N≧1). Because system module 120 is used as an interface between memory module 130 and processing module, each of the memory banks 132 may utilize a different data exchange protocol (e.g., read/write protocol) and different clock signals, and use command and data interfaces 136 and 138 having different widths.

The memory module 130 may comprise the memory banks 132 having different types of the memory cells. The memory module 130 may comprise the memory banks 132 each having different types of the memory cells. For example, the memory banks 132 may comprise arrays of dynamic random access memory (DRAM) cells, static random access memory (SRAM) cells, FLASH memory cells, reduced latency DRAM (RLDRAM) cells, fast-cycle DRAM (FCDRAM) cells, Rambus™ DRAM (RDRAM) cells, and/or double data rate DRAM (DDR DRAM) cells, among other types of memory cells.

The illustrated embodiments of bus 111 includes, for the purpose of example, a command interface 102, a data interface 104, a test data interface 106 and a test command interface 108. In the PMU 100, the system module 120 may be configured to be compatible with an optional external automatic test equipment ATE 150. For example, in some embodiments, system module 120 is configured such that the interfaces 106 and 108 are coupled to, and are pin-compatible with, respectively, interfaces 152 and 154 of external automatic test equipment (ATE) 150. Optionally, interface 152 is configured for communicating test data and interface 154 is configured for communicating test commands. As such, the ATE 150 may be used, without additional interfacing means, for post-assembly testing and monitoring performance and/or data exchanges between the modules 110, 120 and 130 and/or their functional components. ATE 150 is optionally an unmodified prior art test equipment device.

In some embodiments, the system module 120 comprises a processor/ASIC and ATE interface (PAI) module 122, a programmable data/command converter 124, a memory interface module (MIM) 126, and an optional controller 140. The module 122 is coupled to the converter 124 and the converter 124 is coupled to the MIM 126 using interfaces 162 and 164, respectively. The controller 140 is, typically, selectively coupled to the modules 122, 124, and 126, for example by a means of interfaces 166-168.

Programmable data/command converters under the trade name SiPLINK™ are available from Inapac Technology, Inc. of San Jose, Calif. Salient features of the converter adapted for use in the PMU 100 are discussed herein, for example in reference to FIG. 2.

In various embodiments, the controller 140 comprises a programmable logic circuit 142 and a memory bank 144 of, optionally non-volatile (NV), memory cells. A portion 146 of the memory bank 144 is allocated for storing one or more programs executing internal test routines and performance monitoring routines in the PMU 100, as well as for storing pre-programmed configuration settings for the system module 120. The remaining portion (not shown) of the memory bank 144 comprises one or more redundant memory cells, which are optionally used for replacing defective (e.g., failed) cells in the memory banks 132. When the processing module 110 does not comprise logic ASICs, or the PMU 100 does not execute an internal test mode (as discussed elsewhere herein) or facilitate memory repairs, the controller 140 is optional.

In one embodiment, the system module 120 facilitates an operating mode and at least one of external test, monitoring, or internal test modes of the PMU 100.

In an operating mode, the system module 120 captures data/command streams from the processing module 110, converts the captured streams to a communication protocol compatible with a protocol of an addressed memory bank 132, and transmits the converted data/command streams from the processing module 110 to the memory banks 132. In an operating mode, the system module 120 captures data/command streams from memory bank 132, converts the captured streams to a communication protocol compatible with a protocol of the processing module 110, and delivers the converted data streams to the processing module 110. In a further embodiment, the system module 120 stores converted data/command streams and schedules delivery of the streams in a manner maximizing efficiency of communications in the PMU 100.

In the external test mode, via the pin-compatible interfaces 106/152 and 108/154, the ATE 150 executes test procedures and provides active real-time testing of signal flow and/or performance of the processing module 110 and memory banks 132, among other functional components of the PMU 100.

In the monitoring mode, the ATE 150 passively monitors the data/command streams described, for example, in reference to the operating mode for analysis of malfunctioning and/or communication errors in the PMU 100. In this mode, some defects in the memory banks 132 may be "repaired." In the repair process, redundant NV memory cells of the memory bank 144 are substituted for defective memory cells within memory module 130. As part of this repair process, memory interface module 126 is programmed to reroute memory fetches from the defective memory cells to the NV memory cells of the memory bank. This rerouting is transparent to processing module 110.

In the internal test mode, at least a portion of the functions described herein, in reference to the external test and monitoring modes, may be performed in-situ, by executing the test routines stored in the controller 140.

Figure 2:
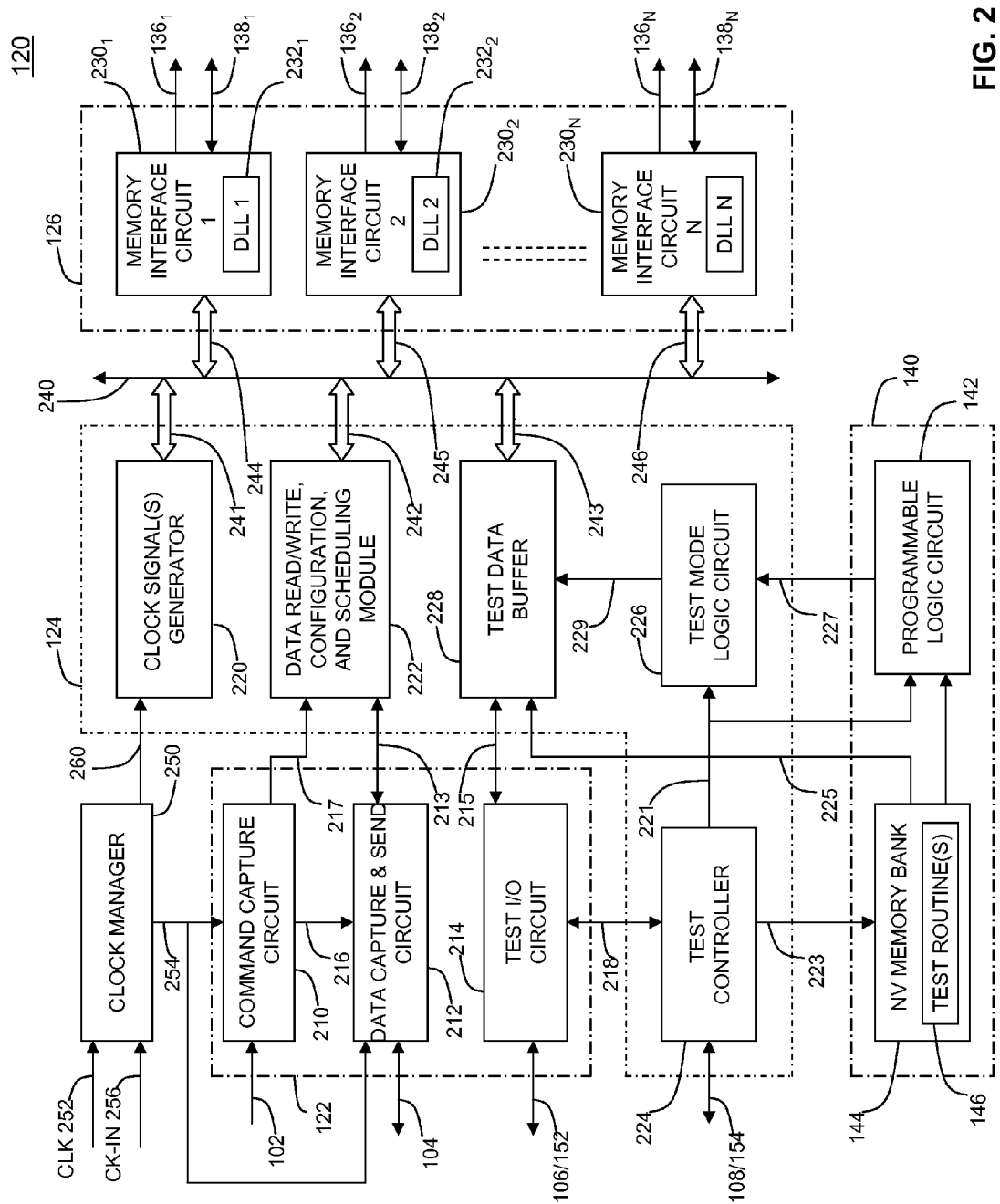
FIG. 2 depicts a block diagram of a system module of the apparatus of FIG. 1, in accordance with various embodiments of the invention.

FIG. 2 depicts a block diagram of system module 120 of the apparatus of FIG. 1. In the depicted embodiment, the module 122 comprises a command capture circuit 210, a data capture & send circuit 212, and a test input/output (I/O) circuit 214. The converter 124 comprises a clock signal(s) generator 220 configured for supplying a clock signal to the memory banks 132, a data read/write configuration and scheduling (DRWCS) module 222, a test controller 224, a test mode logic circuit 226, and a test data buffer 228. The MIM 126 comprises a plurality of N memory interface circuits (MICs) 230 (circuits $230_1$-$230_N$ are shown). In a further embodiment, an instance of MIC circuit 230 includes an optional delay locked loop (DLL) 232 (DLLs $232_1$-$232_N$ are shown).

In various embodiments, a clock manager 250 is configured to provide clock signals to clock signal(s) generator 220, command capture circuit 210 and/or data capture & send circuit 212, via data interfaces 254 and 260. Clock manager 250 optionally includes a phase-locked-loop and may be configured to buffer and manage clock signals received from external devices. For example, in some embodiments, clock manager 250 is configured to receive a CK-IN signal 256 from a crystal oscillator or other device. In some embodiments, clock manager 250 is configured to receive an optional CLK input 252 from devices external to system module 120. These devices may include processor 112, processing module 110, automatic test equipment (ATE) 150, a phase-locked-loop, a clock synthesizer, or the like. In those embodiments wherein clock manager 250 receives clock signals from more than one source, elements of system module 120, memory module 130 and/or processing module 110 may each operate at different clock frequencies. For example, processing module 110 may operate at a first clock frequency while system module 120 and/or memory module 130 operate at a different clock frequency. In alternative embodiments, a clock signal received by clock manager 250 is reduced (e.g., divided by 1.5, 2, 3 or 4 etc.) to produce an additional clock signal at a different frequency. In these embodiments, elements of system module 120 and/or memory module 130 may operated at different frequencies than elements of processing module 110 or automatic test equipment (ATE) 150.

Signal flow between respective components of the modules 122, 124 and 140 is selectively provided by command interfaces 216, 217, 221, 223, 227, and 229 and data interfaces 213, 215, 218, and 225. Accordingly, the signal flow between the PAI module 124 and memory interface circuits 230 is facilitated using data/command buses 241-246 coupled via a data/command system bus 240. Collectively, these buses and interfaces form the buses 162, 164, and 166-168 discussed above in reference to FIG. 1. In one embodiment, the generator 220 uses at least one of clock signals of a processor or logic ASIC of the processing module 110 as a base signal(s) to form one or more clock signals for the memory banks 132.

In the depicted embodiment, configuration/scheduling settings for the DRWCS module 222 may be provided by the processing module 110 via a path comprising the data interfaces 104, 213 and the data capture & send circuit 212 and initiated by a command communicated via a path comprising the command interfaces 102, 217 and the command capture circuit 210. In an alternate embodiment (not shown), the controller 140 may be used to program the DRWCS module 222 via the data and command links coupled to, e.g., the interfaces 213 and 217, respectively. In yet another contemplated embodiment (not shown), the ATE 150 or other external programming device (e.g., computer) may similarly be used to program the DRWCS module 222.

In operation, the DRWCS module 222 matches data exchange protocols used by components of the processing module 110 (e.g., processor 112 or 114) and the addressed memory bank 132, temporarily stores the converted data and/or commands (e.g., in an internal buffer (not shown)), and transmits the stored data and commands to the intended addressees. In one embodiment, the DRWCS module 222 selectively converts outgoing signals of the processing module 110 in one on more protocols compatible with the respective memory banks 132 and converts the outgoing signals from the memory banks 132 into the protocols compatible with the addressed processor or logic ASIC of the processing module 110. In a further embodiment, to increase efficiency of cross-module communications in the PMU 100, the DRWCS module 222 provides scheduling (or grouping) of the stored information before transmitting to the respective destination.

In an operating mode, data and commands from the processing module 110 (via a path comprising the data interfaces 104, 213 and the data capture & send circuit 212 and a path comprising command interfaces 102, 217 and the command capture circuit 210, respectively) in a memory-compatible format are placed, via a bus 242, on the system bus 240. In the depicted embodiment, configuration settings for the data capture circuit 212 may be provided, via the interface 216, by the processing module 110. From the system bus 240, such data and commands become available to the MICs 230 each selectively coupled to the respective memory bank 132.

In an external test mode, test data and test commands from the ATE 150 are placed, via a bus 243, on the system bus 240 and become available to the MICs 230 and memory banks 132, as well as to the processing module 110. These test commands may be communicated via a path comprising the data interfaces 106/152, 215 and the test I/O circuit 214 and test data buffer 228, and a path comprising command interfaces 108/154, 221, 229 and the test controller 224 and test mode logic circuit 226, respectively. In an alternate embodiment, the ATE 150 and processing module 110 may control configuration settings of the programmable logic circuit 142, via the interfaces 108/154, the test controller 224, and interfaces 221 and 223.

Similarly, in the monitoring mode, the ATE 150 may monitor data/command exchanges in the system module 120. These exchanges are optionally made via the bus 243, the test data buffer 228, the test I/O circuit 214, and the data interface 106/152.

In the internal test mode, at least a portion of the test data and test commands provided or monitored by the ATE 150 in the external test and monitoring modes, may be similarly provided or monitored, via the interfaces 225 and 227, using the controller 140.

Figure 3:
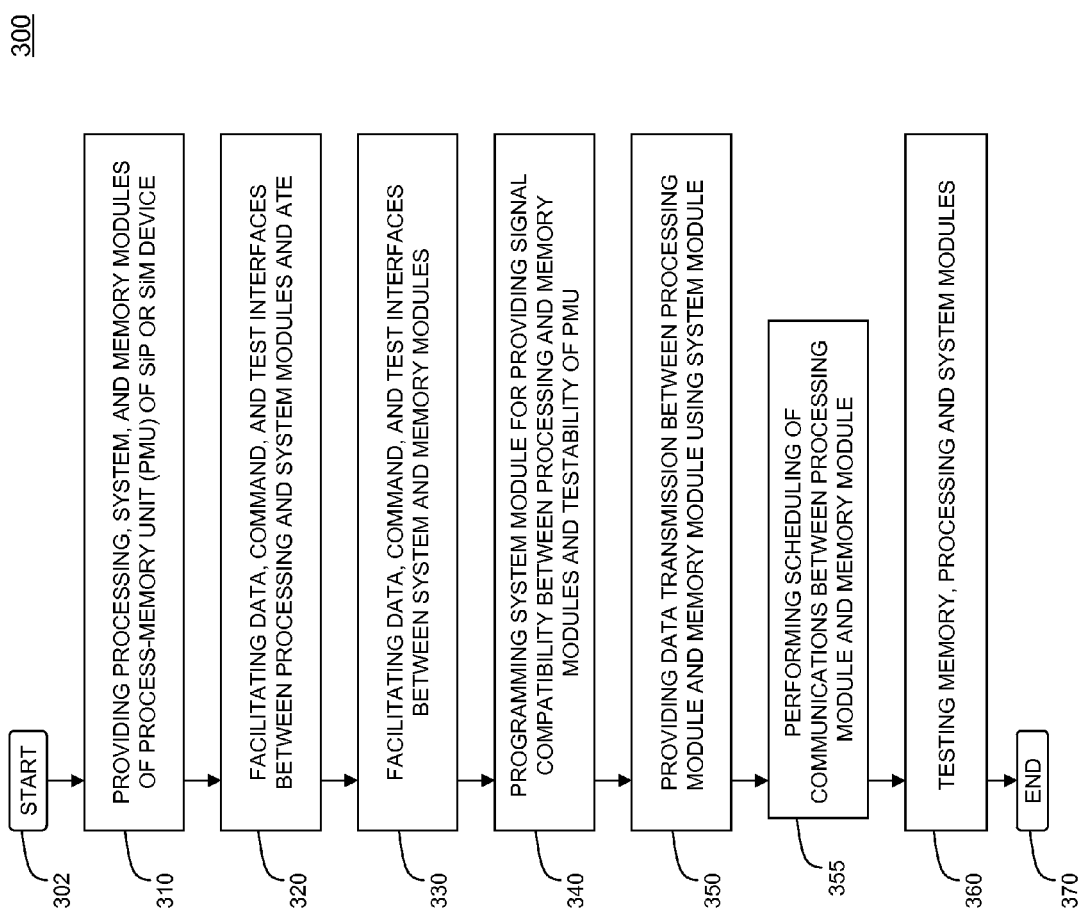
FIG. 3 depicts a flow diagram illustrating a method for using the apparatus of FIG. 1, in accordance with various embodiments of the present invention.

FIG. 3 depicts a flow diagram illustrating a method 300 in accordance with various embodiments. The method 300 includes processing steps performed for assembling and testing the PMU 100 (e.g., steps 310-340), as well as steps for using the PMU 100 (e.g., steps 350-370). The assembly and use of PMU 100 are optionally performed as separate methods. In some embodiments, the illustrated steps are sequentially performed in the depicted order. In alternate embodiments, some of the steps may be performed contemporaneously or in a different order. To best understand the invention, the reader should simultaneously refer to FIGS. 1-3.

The method 300 starts at step 302 and proceeds to step 310. At step 310, the processing module 110, system module 120, and memory module 130 of the PMU 100 are provided and received for assembly. For example, the processing module 110, system module 120, and memory module 130 may be received for inclusion in SiP or SiM devices.

At step 320 data, command, and test interfaces are facilitated between the processing module 110, system module 120, and ATE 150. This facilitation may include construction of electrical interconnects, command interfaces, data busses, signal channels, soldering of bond pads, or the like. The system module 120 encompasses programmable processor/ASIC-memory interfacing capabilities and shares the same pin-compatible test interfaces 106/152 (data) and 108/154 (commands) with the processing module 110 and external ATE 150.

At step 330, data, command, and test interfaces are facilitated between the system module 110 and memory module 130. This facilitation may include construction of electrical interconnects, command interfaces, data busses, signal channels, soldering of bond pads, or the like. The facilitation of steps 320 and 330 can also include packaging of the components, providing signals to the interfaces, or the like.

At step 340, the system module 120 is programmed to provide signal/protocol compatibility between the processing module 110 and the memory banks 132 of the memory module 130, as well as, optionally, for providing external (ATE 150) and/or internal (controller 140) testability of the PMU 100. Configuration settings for use in programming may be provided to the system module using the processing module 110, ATE 150, or external programming device.

At step 350, the system module 120 is used to perform data and/or command communications between the processing module 110 and memory module 130 by converting the incoming and outgoing data/command streams into formats compatible with the protocols and requirements of the respective recipients of these streams, as discussed above in reference to the operating mode of the PMU 100.

In an optional step 355, to increase efficiency of cross-module communications in the PMU 100, the DRWCS module 222 is used to schedule transmission of outgoing data/command streams to their respective destinations.

At an optional step 360, functional components of the memory module 130 and processing module 110, as well as portions of the system module 120, are tested/monitored using the ATE 150 or controller 140, as discussed above in the context of the external test, monitoring, and internal test modes of the PMU 100.

At step 370, upon completion of step 360, the method 300 ends.

While the foregoing is directed to the illustrative embodiment of the present invention, other and further embodiments of the invention may be devised by those skilled in the art without departing from the basic scope thereof that is determined by the claims that follow.

What is claimed is:

1. A processor-memory unit comprising:
a processing module and a memory module both included in one of a system-in-package (SiP) and a system-in-module (SiM) device, the memory module including at least a first memory bank; and
a programmable system module coupled to the processing module and to the memory module, the programmable system module being programmable to act as an interface between the processing module and the memory modules such that the processing module and the memory module may utilize different data exchange protocols and have command and data interfaces with different widths.

2. The processor-memory unit of claim 1, wherein the programmable system module is further configured to allow testing of the memory module and the processing module through the programmable system module.

3. The processor-memory unit of claim 1, wherein the programmable system module is further configured to couple to external automatic test equipment (ATE).

4. The processor-memory unit of claim 3, wherein the processing module and the programmable system module include one or more test interfaces that are pin-compatible with a test interface of the ATE.

5. The processor-memory unit of claim 1, wherein the processor module includes multiple processors coupled to a same bus.

6. The processor-memory unit of claim 1, wherein the processor module includes multiple logic application-specific integrated circuits (ASIC) coupled to a same bus.

7. The processor-memory unit of claim 1, wherein the programmable system module includes a processor or ASIC interface module coupled to the processing module, a programmable data or command converter, and a memory interface module coupled to the memory module.

8. The processor-memory unit of claim 7, wherein the programmable data or command converter comprises a programmable data read or write, configuring, and scheduling (DRWCS) module, said DRWCS module configured to couple the processor or ASIC interface module and the memory interface module.

9. The processor-memory unit of claim 7, wherein the memory interface module comprises a plurality of memory interface circuits, each of the plurality of memory interface circuits coupled to the DRWCS module and to at least one memory bank of the memory module.

10. The processor-memory unit of claim 9, wherein each of the memory interface circuits further comprises a delay locked loop (DLL).

11. The processor-memory unit of claim 7, wherein the programmable system module further comprises a controller including a programmable logic circuit and a bank of redundant memory cells.

12. The processor-memory unit of claim 11, wherein the controller is configured to perform at least one of:
modification of configuration settings of the converter;
modification of configuration settings of the DRWCS module;
replacement of defective memory cells in the memory module with the redundant memory cells; and
testing of portions of the memory module and the processing module.

13. The processor-memory unit of claim 1, wherein the memory module further includes a second memory bank and wherein the first memory bank includes memory cells of a first type and the second memory bank includes memory cells of a second type that is different from the first type.

14. The processor-memory unit of claim 1, wherein the first memory bank uses a first data exchange protocol, and wherein the memory module further includes a second memory bank using a second data exchange protocol that is different from the first data exchange protocol.

15. The processor-memory unit of claim 1, wherein the first memory bank uses a first clock signal having a first frequency, and wherein the memory module further includes a second memory bank using a second clock signal having a second frequency that is different from the first frequency.

16. The processor-memory unit of claim 1, wherein a data transfer rate of the processing module is different from a data transfer rate of the first memory bank.

17. The processor-memory unit of claim 1 wherein widths of data or command interfaces of the processing module are different from widths of data or command interfaces of the first memory bank.

18. A method comprising:
  programming a system module to provide signal or protocol compatibility between a processing module and a memory module, the memory module including at least one memory bank, wherein the processing module and the memory module utilize different data exchange protocols and are configured for inclusion in one of a system-in-package (SiP) and a system-in-module (SiM) device; and
  facilitating data and command interfaces between the processing module and the system module and data and command interfaces between the system module and the memory module to allow information exchange between the processing module and the memory module through the system module.

19. The method of claim 18, further including testing at least portions of the memory module through the system module.

20. The method of claim 18, further comprising communicatively coupling an external automatic test equipment (ATE) to the memory module via the system module.

21. The method of claim 20, further comprising electronically coupling the external automatic test equipment to the system module through a pin-compatible test interface.

22. The method of claim 20, wherein programming the system module includes programming the system module using at least one of the processing module and the external automatic test equipment.

23. The method of claim 18, wherein the system module includes:
  a processor or ASIC interface module coupled to the processing module,
  a programmable data or command converter, and
  a memory interface module coupled to the memory module.

24. The method of claim 23, wherein the programmable data or command converter includes a programmable data read or write, configuring, and scheduling (DRWCS) module, the programmable data or command converter is configured to couple the processor or ASIC interface module and the memory interface module, and the programmable data or command converter is further configured to provide:
  signal or protocol compatibility between communicating components of the processing module and the memory module, or
  scheduling of information exchanges between the processing module and the memory module.

25. The method of claim 24, wherein the memory interface module comprises a memory interface circuit configured to facilitate communications between the DRWCS module and a memory bank of the memory module.

26. The method of claim 25 wherein the memory interface circuit comprises a delay locked loop (DLL).

27. The method of claim 23 wherein the system module further comprises a controller including a programmable logic circuit and a bank of redundant memory cells, said controller configured to perform at least one of:
  modifying configuration settings of the converter;
  modifying configuration settings of the DRWCS module;
  substituting defective memory cells in the memory module with the redundant memory cells; and
  testing of at least portions of the memory module and the processing module.

28. The method of claim 18, wherein the memory module includes at least two memory banks, a first of the two memory banks comprising a first type of memory cell and a second of the two memory banks comprising a second type of memory cell, the first type being different from the second type.

29. The method of claim 18, wherein the memory module includes at least two memory banks, and programming the system module includes programming the system module to provide signal or protocol compatibility between a first of the two memory banks and a second of the two memory banks, the first and the second of the two memory banks configured to use different communication protocols.

30. The method of claim 18, wherein programming the system module includes programming the system module to provide signal or protocol compatibility between the at least one memory bank and the processing module, the at least one memory bank and the processing module being configured to use different clock signal frequencies.

31. The method of claim 18, wherein programming the system module includes programming the system module to provide signal or protocol compatibility between the at least one memory bank and the processing module, the at least one memory bank and the processing module being configured to use different data transfer rates.

32. The method of claim 18, wherein programming the system module includes programming the system module to provide signal or protocol compatibility between the at least one memory bank and the processing module, the at least one memory bank and the processing module being configured to use different widths of data or command interfaces.

33. A processor-memory unit comprising:
  a processing module and a memory module both included in one of a system-in-package (SiP) and a system-in-module (SiM) device, the memory module including at least one memory bank, wherein the processing module and the memory module utilize different data exchange protocols; and
  programmable means for providing signal or protocol compatibility between the processing module and the memory module, and for testing the memory module and the processing module.

* * * * *